(12) United States Patent
Kim et al.

(10) Patent No.: US 11,004,868 B2
(45) Date of Patent: May 11, 2021

(54) MEMORY FIELD-EFFECT TRANSISTORS AND METHODS OF MANUFACTURING THE SAME

(71) Applicant: Intel Corporation, Santa Clara, CA (US)

(72) Inventors: Seiyon Kim, Portland, OR (US); Uygar E. Avci, Portland, OR (US); Joshua M. Howard, Portland, OR (US); Ian A. Young, Portland, OR (US); Daniel H. Morris, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/487,417

(22) PCT Filed: Mar. 22, 2017

(86) PCT No.: PCT/US2017/023531
§ 371 (c)(1),
(2) Date: Aug. 20, 2019

(87) PCT Pub. No.: WO2018/174865
PCT Pub. Date: Sep. 27, 2018

(65) Prior Publication Data
US 2019/0378845 A1    Dec. 12, 2019

(51) Int. Cl.
| | |
|---|---|
| *H01L 29/78* | (2006.01) |
| *H01L 27/1159* | (2017.01) |
| *H01L 21/28* | (2006.01) |
| *H01L 27/11592* | (2017.01) |
| *H01L 29/51* | (2006.01) |

(52) U.S. Cl.
CPC .... *H01L 27/1159* (2013.01); *H01L 27/11592* (2013.01); *H01L 29/40111* (2019.08); *H01L 29/516* (2013.01)

(58) Field of Classification Search
CPC ......... H01L 27/11502; H01L 27/11585; H01L 29/40111; H01L 29/516; H01L 29/6684; H01L 29/78391
See application file for complete search history.

(56) References Cited

U.S. PATENT DOCUMENTS

| | | | |
|---|---|---|---|
| 2003/0068848 A1 | 4/2003 | Sheng et al. |
| 2005/0059172 A1 | 3/2005 | Kim |
| 2006/0118844 A1 | 6/2006 | Kijima et al. |
| | (Continued) | | |

OTHER PUBLICATIONS

International Search Report and Written Opinion from PCT/US2017/023531 dated Dec. 18, 2017, 13 pgs.

*Primary Examiner* — Jae Lee
(74) *Attorney, Agent, or Firm* — Green, Howard & Mughal LLP

(57) ABSTRACT

Memory field-effect transistors and methods of manufacturing the same are disclosed. An example apparatus includes a semiconductor substrate and a ferroelectric gate insulator of a memory field-effect transistor formed within a trench having walls defined by spacers and a base defined by the semiconductor substrate. The apparatus further includes a gate conductor formed on the ferroelectric gate insulator. The ferroelectric gate insulator is to separate a bottom surface of the gate conductor and the substrate.

17 Claims, 7 Drawing Sheets

(56) References Cited

U.S. PATENT DOCUMENTS

| | | | |
|---|---|---|---|
| 2013/0270619 A1* | 10/2013 | Schloesser | H01L 29/40111 257/295 |
| 2016/0071947 A1* | 3/2016 | Wiatr | H01L 29/66545 257/295 |
| 2016/0133717 A1 | 5/2016 | Ramaswamy et al. | |
| 2016/0163821 A1 | 6/2016 | Bentum et al. | |

* cited by examiner

MEMORY FIELD-EFFECT TRANSISTORS AND METHODS OF MANUFACTURING THE SAME

CLAIM OF PRIORITY

This Application is a National Stage Entry of, and claims priority to, PCT Application No. PCT/US2017/023531, filed on 22 Mar. 2017 and titled "MEMORY FIELD-EFFECT TRANSISTORS AND METHODS OF MANUFACTURING THE SAME", which is incorporated by reference in its entirety for all purposes.

FIELD OF THE DISCLOSURE

This disclosure relates generally to semiconductors, and, more particularly, to memory field-effect transistors and methods of manufacturing the same.

BACKGROUND

Considerations in manufacturing memory devices include the density of the components used to make such devices, the amount of power required to operate such devices, and the performance or operation speed of such devices. For example, Dynamic Random Access Memory (DRAM) uses one transistor and one capacitor to form a single memory cell (to store one bit of data), which is denser than Static Random Access Memory (SRAM) that uses six transistors for a single memory cell. However, SRAM typically exhibits faster performance with less power consumption than DRAM.

Figure 1:
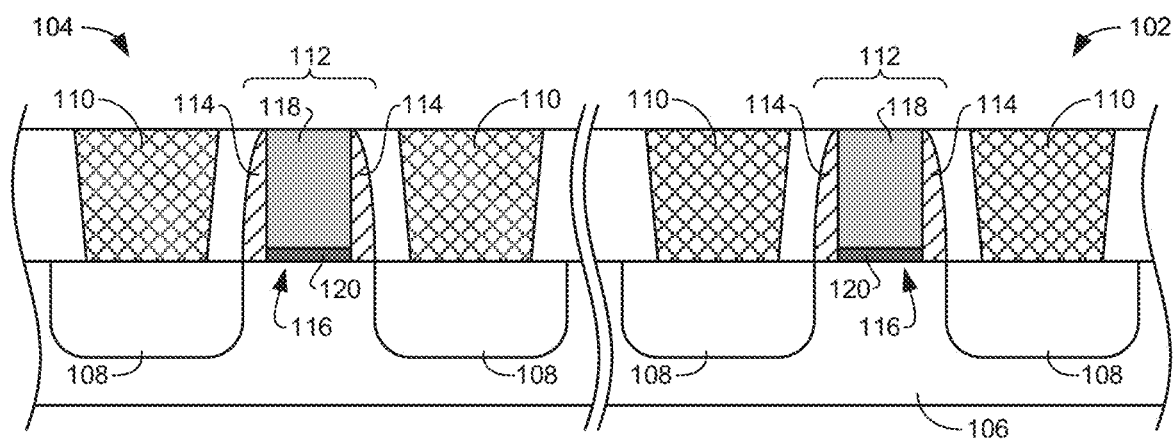
FIG. 1 is cross-sectional view of an example logic field-effect transistor (FET) and an example memory FET both partially formed on a common semiconductor substrate.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

In accordance with the teachings disclosed herein, example memory field-effect transistors (FETs) have a structure that may be formed using semiconductor manufacturing processes similar to and/or compatible with processes used to construct logic FETs. As a result, examples disclosed herein improve the integrability of logic and memory FETs on the same semiconductor substrate by enabling many processes to be performed simultaneously for both types of transistors. The teachings disclosed herein may be implemented in connection with transistors having any of a planar, a trigate, or a gate-all-around structure and/or any other suitable structure.

One significant difference between known logic FETs and the example memory FETs disclosed herein is the material used as the gate insulator to separate the semiconductor substrate from the gate metal or gate conductor. Typical logic FETs have a gate insulator made of a dielectric material such as, for example, silicon oxide ($SiO_x$) or hafnium oxide ($HfO_x$). By contrast, in accordance with the teachings disclosed herein, the example memory FETs use a ferroelectric material as the gate insulator. In some examples, the ferroelectric material is at least one of hafnium zirconium oxide ($Hf_xZr_yO_z$), hafnium oxide ($HfO_x$), or zirconium oxide ($ZrO_x$). In some examples, the ferroelectric material may be formed with a laminate or sandwich of multiple materials (e.g., a layer of $Hf_xZr_yO_z$ and a layer of $HfO_x$). In some examples, the ferroelectric material may be in a doped form to include a dopant (e.g., silicon) to add strain. Aside from the difference in material for the gate insulator, in some examples, the structures of the example memory FETs are substantially identical to logic FETs. Therefore, many of the fabrication processes to form such memory FETs may be performed at the same time as the processes are being carried out for the logic FETs. This improved integrability of memory and logic FETs can provide substantial cost savings.

In addition to differences in the material of the gate insulator, in some examples, the memory FETs described herein may have differences in the thickness of the gate insulator relative to similarly designed logic FETs. More particularly, in some examples, the thickness of the ferroelectric material in a memory FET is greater along the bottom surface of the gate (e.g., between the substrate and the gate conductor) than up the sides of the gate. In some examples, the ferroelectric material is located exclusively along the bottom surface of the gate without extending up the sides of the gate. Several different techniques are described to achieve this novel structure for memory FETs.

The use of ferroelectric materials in example memory FETs in the place of the dielectric material of similarly designed logic FETs, enable 1T and 2T volatile memory cells with potentially higher speeds and greater density than SRAM and DRAM memory cells. Furthermore, example memory FETs disclosed herein may also be used to manufacture non-volatile memory cells with relatively high speed and improved density over other known memory devices. Greater density is made possible, in part, because a single memory FET constructed in accordance with the teachings disclosed herein may be implemented as a single memory cell. For example, a conventional 1T-1C eDRAM memory has dimensions of 2 contacted gate pitches by 1.5 to 2 metal pitches, while a dense six transistor SRAM cell has dimensions of 2 contacted gate pitches by 5 or more metal pitches. By contrast, a memory FET constructed in accordance with the teachings disclosed herein (e.g., a 1T+1FE-FEFET bit cell or a 1FE-FET bit cell) may have a dimension of 1 or 2 contacted gate pitches with dimensions in the orthogonal direction potentially as small as a single metal pitch.

Furthermore, the structure and manufacturing processes of the example memory FETs disclosed herein are highly scalable such that the example memory FETs can be manufactured with overall smaller dimensions than other known memory devices while still providing reliable operation. For example, typical 1T-1C bit cells require a relatively large charge storage capacitor. This capacitor may be formed by a trench with a height to width aspect ratio exceeding 5:1 at the 22 nm technology node. This aspect ratio increases for future nodes, thereby limiting manufacturability. By contrast, bit cells manufactured using the example memory FETs disclosed herein do not require a storage capacitor and, therefore, may be manufactured in more scaled process technologies.

Additionally, the example memory FETs also have performance advantages over 1T-1C eDRAM (embedded DRAM). Embedded DRAM transistors sacrifice performance to achieve the low leakage needed for retention of memory state (e.g., IOFF<0.1 pA/µm). The performance of the 1T-1C eDRAM may by slower than 3 nanoseconds for both read and write operations. By contrast, example memories implemented in accordance with the teachings disclosed herein do not need to maintain a low IOFF so they may be engineered for higher performance. Additionally, such memories can drive high bit-line currents enabling the use of faster sense-amplifiers, thereby resulting in performance speeds significantly faster than 3 nanoseconds.

FIGS. 1-5 illustrate progressive stages of fabrication of an example memory FET 102 and an example logic FET 104 integrated on a common semiconductor substrate 106. The substrate 106 may be formed from any suitable semiconductor material such as, for example, silicon (Si), germanium (Ge), gallium arsenide (GaAs), etc. At the stage of manufacture shown in the illustrated example of FIG. 1, the memory FET 102 and the logic FET 104 are substantially identical having been manufactured using the same processes. Thus, as shown in the illustrated example, the substrate 106 associated with each FET 102, 104 includes doped regions 108 corresponding to the source and drain of each FET 102, 104. Further, in the illustrated example, a first layer of metal wiring 110 has been formed on top of the respective doped regions 108 associated with each FET 102, 104. The metal wiring 110 may be formed using any suitable metal such as, for example, aluminum (Al), or copper (Cu).

Additionally, as shown in FIG. 1, a gate assembly 112 has been formed for each of the FETs 102, 104 on the substrate 106 between the corresponding doped regions 108. In the illustrated example of FIG. 1, the gate assembly 112 includes spacers 114 formed on either side of a sacrificial gate 116. The spacers 114 may be formed from any suitable dielectric material (e.g., an oxide). The sacrificial gate 116 includes a gate metal or gate conductor 118 and a gate insulator 120 separating the substrate 106 and the gate conductor 118. The sacrificial gate 116, as its name implies, is sacrificial in that it is formed temporarily and subsequently removed to enable further processing of the FETs 102, 104. Among other things, the sacrificial gate 116 serves to define a space or shape for final gate materials to be formed. Additionally, the sacrificial gate 116 serves to protect the final gate materials by enabling processes to be implemented for the FETs without impacting the final gate materials because the processes are performed before the final gate materials are formed but after the sacrificial gate 116 is formed. Inasmuch as the sacrificial gate 116 is removed during subsequent processing, the sacrificial gate 116 may be formed of any suitable material. In some examples, the gate insulator 120 is formed of silicon dioxide (SiO₂) and the gate conductor 118 is formed of polysilicon.

Figure 2:
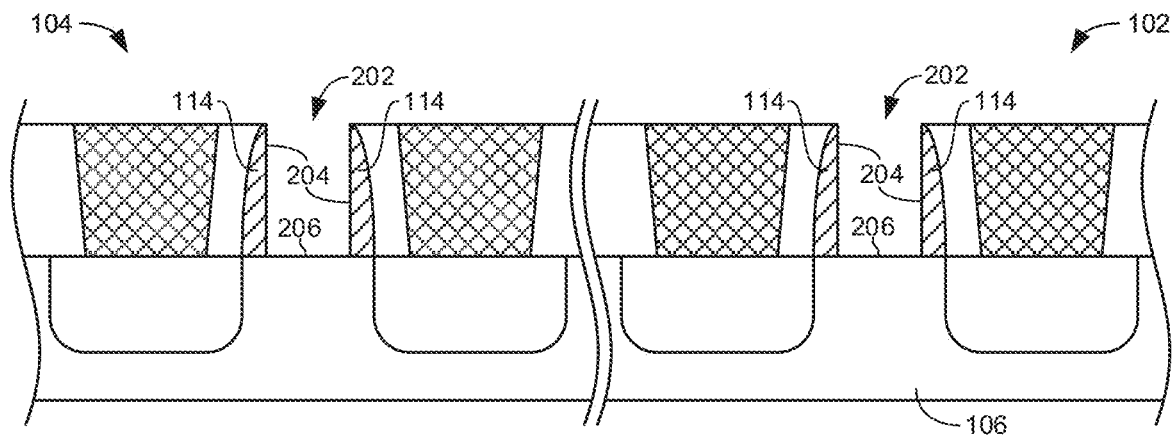
FIG. 2 is a cross-sectional view of the example FETs of FIG. 1 after removal of the sacrificial gate materials.

FIG. 2 illustrates the example memory and logic FETs 102, 104 of FIG. 1 after removal of the sacrificial gates 116 for each FET 102, 104. In the illustrated example, both the gate conductor 118 and the gate insulator 120 have been removed. In some examples, the materials are removed in two successive processes. In some examples, the gate conductor 118 is removed while the gate insulator 120 is preserved. That is, as described more fully below, in some examples, the gate insulator 120 may not be sacrificial but retained and used as the final gate insulator (or at least a part of the final gate insulator) underneath a subsequently deposited final gate conductor. In any event, as shown in FIG. 2, the removal of the sacrificial gate 116 results in a trench 202 defined by walls 204 corresponding to the spacers 114 and a base 206 corresponding to the exposed surface of the substrate 106.

Figure 3:
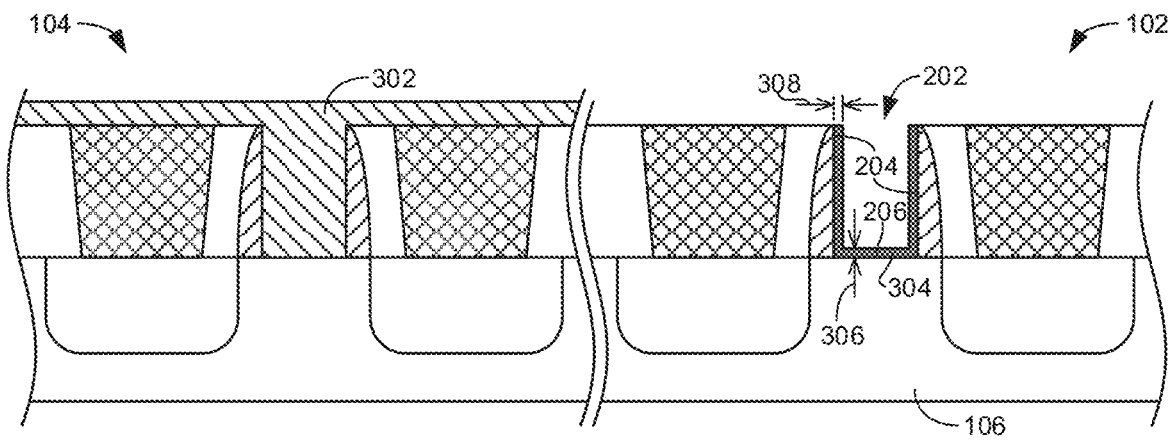
FIG. 3 is a cross-sectional view of the example FETs of FIG. 2 after covering the logic FET with a mask and forming a ferroelectric gate insulator for the memory FET.
Figure 4:
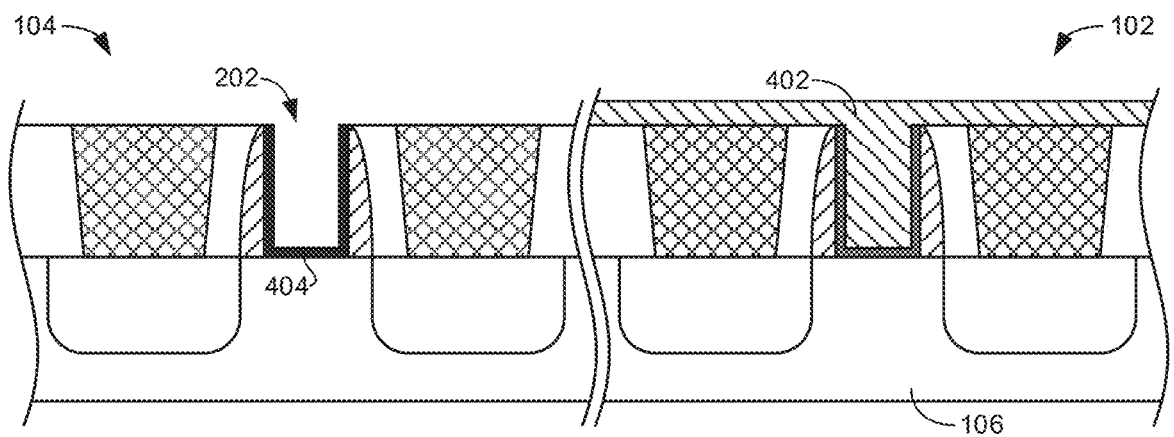
FIG. 4 is a cross-sectional view of the example FETs of FIG. 3 after covering the memory FET with a mask and forming a dielectric gate insulator for the logic FET.

FIG. 3 is a cross-sectional view of the example memory and logic FETs 102, 104 of FIG. 2 further processed by covering the logic FET 104 with a mask 302 and forming a gate insulator 304 for the memory FET 102 within the corresponding trench 202. FIG. 4 is a cross-sectional view of the example memory and logic FETs 102, 104 of FIG. 3 further processed by removing the mask 302 covering the logic FET 104, covering the memory FET 102 with a second mask 402, and forming a gate insulator 404 for the logic FET 104 within the exposed trench 202. In the illustrated example of FIGS. 3 and 4, the masks 302, 402 serve to protect the corresponding memory FET 102 or logic FET 104 while the other exposed FET undergoes further fabrication processes specific to the exposed FET (e.g., the memory FET 102 when the logic FET 104 is covered by the mask 302 and the logic FET 104 when the memory FET 102 is covered by the mask 402). In the illustrated example, the processes specific to the memory FET 102 include the formation of the gate insulator 304. Similarly, the processes specific to the logic FET 104 include the formation of the gate insulator 404. While the illustrated example shows the gate insulator 304 for the memory FET 102 being formed first (when the logic FET 104 is masked) and then forming the gate insulator 404 for the logic FET 104 second (when the memory FET with the gate insulator 304 is masked), in other examples the order of operations may be reversed. That is, in some examples, the gate insulator 404 for the logic FET 104 may be formed first (while the memory FET 102 is masked) and then the logic FET 104 is masked followed by the gate insulator 304 for the memory FET 102 being formed.

In the illustrated example, the gate insulators 304, 404 associated with the separate memory and logic FETs 102, 104 are formed during different processes because the gate insulators 304, 404 are made of different materials. In particular, the gate insulator 404 for the logic FET 104 may be formed of any suitable dielectric material such as, for example, silicon oxide ($SiO_X$) or hafnium oxide ($HfO_X$). In contrast to the dielectric material used for the gate insulator 404 of the logic FET 104, the gate insulator 304 of the memory FET 102 is formed of a ferroelectric material. Example ferroelectric materials include hafnium zirconium oxide ($Hf_XZr_YO_Z$), hafnium oxide ($HfO_X$), and zirconium oxide ($ZrO_X$). In some examples, such materials may include a dopant (e.g., silicon (Si)) to add strain.

In some examples, the gate insulators 304, 404 are formed within the trenches 202 using a conformal deposition technique. Conformal deposition results in a layer of material forming on exposed surfaces that has a substantially even thickness regardless of the orientation of the surfaces. Thus, as represented in FIG. 3, a first thickness 306 of the gate insulator 304 of the memory FET 102 at the base 206 of the trench 202 (along the surface of the substrate 106) is substantially the same as a second thickness 308 of the gate insulator 304 extending up the walls 204 of the trench 202. While conformal deposition may be used to form the gate insulators 304, 404 for both the memory FET 102 and the logic FET 104, the particular thickness of the gate insulator in each case need not be the same. That is, while in some examples, as shown in FIG. 4, the thickness of both gate insulators 304, 404 is substantially the same, in other examples, the thickness of each gate insulator 304, 404 may differ from the other as appropriate.

Figure 5:
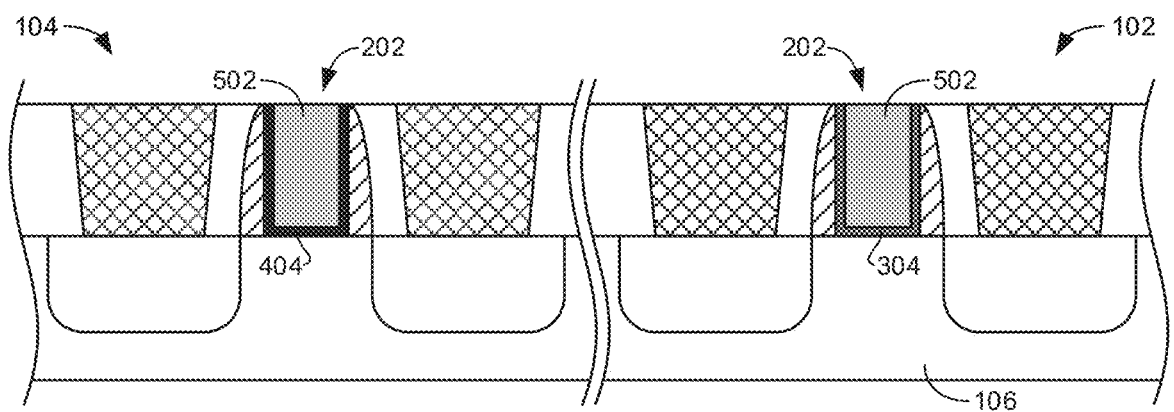
FIG. 5 is a cross-sectional view of the example FETs of FIG. 4 after forming a gate conductor for each of the example FETs.

FIG. 5 is a cross-sectional view of the example memory and logic FETs 102, 104 of FIG. 4 after forming a gate metal or gate conductor 502 for each of the example FETs that conforms to the shape of the corresponding trench 202 (and associated gate insulator 304, 404). Unlike the gate insulators 304, 404 of the separate memory and logic FETs 102, 104 that are made of different types of materials, in the illustrated example, the gate conductors 502 for both FETs 102, 104 are formed of the same material. The gate conductors 502 may be formed of any suitable metal such as, for example, titanium nitride (TiN), titanium silicon nitride (TiSiN), tantalum nitride (TaN), tungsten (W), aluminum (Al), titanium oxide (TiO), vanadium nitride (VN), vanadium silicon nitride (VSiN), platinum (Pt), lutetium (Lu), etc. In some examples, the gate conductor 502 for each of the memory FET 102 and the logic FET 104 are formed at the same time (e.g., during the same manufacturing process). Thus, in some examples, the processes used to form the memory FET 102 of FIG. 5 are substantially the same as the processes used to form the logic FET 104 of FIG. 5 except for the processes specific to the formation of the respective gate insulators 304, 404 as described above. Furthermore, the structure and material of the memory FET 102 of FIG. 5 is substantially the same as the logic FET 104 of FIG. 5 except for the differences in the material (and possibly thickness) of the respective gate insulators 304, 404 as described above. In some examples, the gate conductors 502 for the different FETs 102, 104 may be formed of different materials (e.g., to achieve proper functioning for turn-on voltage targeting) and/or during different processes.

The similarities in the manufacturing processes, structures, and materials of the memory and logic FETs 102, 104 disclosed herein greatly facilitate the integrability of memory FETs and logic FETs on the same semiconductor substrate (i.e., the same wafer). As a result, the examples disclosed herein provide significant cost benefits over existing semiconductor manufacturing processes. Furthermore, forming memory FETs (e.g., the memory FET 102) with a structure similar to the logic FET 104 improves the scalability of such memory FETs, thereby enabling the production of smaller and/or denser memory devices than is currently possible using known manufacturing processes.

Figure 6:
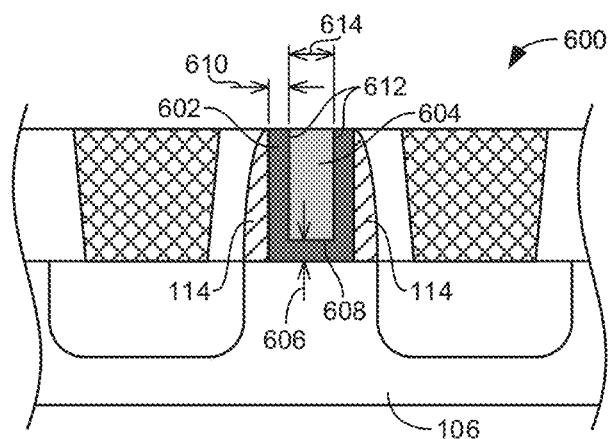
FIG. 6 is a cross-sectional view of an example memory FET similar to the memory FET of FIG. 5 except with a thicker ferroelectric gate insulator.

As mentioned above, the thickness of the gate insulators 304, 404 in the memory and logic FETs 102, 104 may not be the same thickness. In particular, a relatively thick ferroelectric gate insulator 304 between the substrate 106 and the gate conductor 502 of the memory FET 102 may be beneficial to increase the impact of the ferroelectric properties of the gate insulator 304. Accordingly, in some examples, the thickness 306 (FIG. 3) of the gate insulator 304 of the memory FET 102 may be greater than the thickness of the gate insulator of the logic FET 104. However, when conformal deposition techniques are used, as described above, increasing the thickness of the gate insulator at one location will result in a corresponding increase in the thickness of the gate insulator at other locations. For example, FIG. 6 is a cross-sectional view of an example memory FET 600 similar to the memory FET 102 of FIG. 5 except with a thicker ferroelectric gate insulator 602 separating the substrate 106 from a gate conductor 604. That is, in the illustrated example of FIG. 6, the gate insulator 602 has a first thickness 606 between a surface of the substrate 106 and a bottom surface 608 of the gate conductor 604 that is substantially the same as a second thickness 610 between the spacers 114 and lateral (e.g., vertical) surfaces 612 of the gate conductor 604. As can be seen from a comparison of the illustrated examples, the first and second thicknesses 606, 610 of the gate insulator 602 of FIG. 6 are greater than the first and second thicknesses 306, 308 (FIG. 3) of the gate insulator 304 of the memory FET 102 of FIGS. 3-5.

As shown in the illustrated example of FIG. 6, the increased thickness 606, 610 of the gate insulator 602 results in a decrease in a thickness 614 of the gate conductor 604. If the thickness 606, 610 of the gate insulator 602 was further increased beyond that shown in FIG. 6, at some point, there would be no space for the gate conductor 604 because the opposing sides of the gate insulator 602 would meet in the middle. This problem, sometimes referred to as gate pinching, may also arise for a fixed thickness of the gate insulator as all other dimensions of the memory FET 600 decrease in size. That is, while the memory FET 600 of FIG. 6 is described above as being comparable in size to the memory FET 102 of FIG. 5 but with a thicker gate insulator 602, FIG. 6 may alternatively represent a scaled (e.g., smaller) memory FET with a gate insulator 602 having approximately the same thickness as the gate insulator 304 of FIG. 5. Viewed from this perspective, the relative size (thickness) of the gate insulator 602 of FIG. 6 appears larger than in FIG. 5, because the overall dimensions of the memory FET 600 of FIG. 6 have decreased. Thus, as transistors become smaller, gate pinching still presents a problem even for relatively thin layers of ferroelectric material used as a gate insulator between the substrate 106 and the gate conductor 604.

Figure 7:
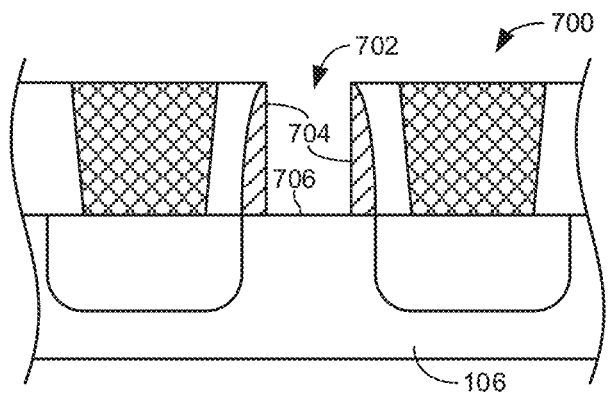
FIGS. 7-10 illustrate progressive stages of fabrication of another example memory FET.
Figure 8:
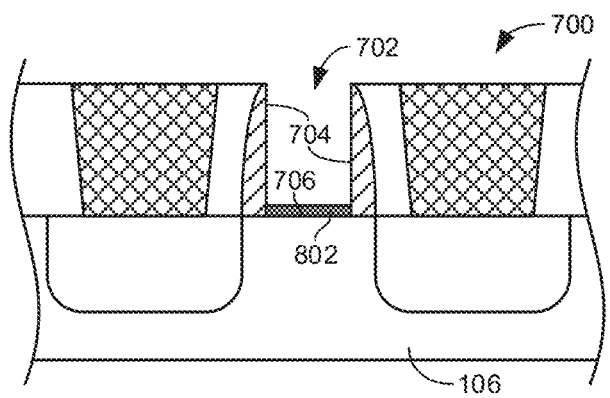

Examples described below in connection with FIGS. 7-17 overcome the problem of gate pinching while still achieving desired thicknesses of ferroelectric material along the bottom surface of a gate conductor by fabricating the gate insulator with a first thickness along the bottom surface of the gate conductor (e.g., substantially parallel to the surface of the underlying substrate 106) that is greater than a second thickness extending along the lateral (e.g., vertical) surfaces of the gate conductor (e.g., substantially perpendicular to the substrate 106). In particular, FIGS. 7-10 illustrate progressive stages of fabrication of another example memory FET 700. FIG. 7 illustrates the example memory FET 700 with a trench 702 defined by walls 704 and a base 706 after removal of a sacrificial gate. Thus, the memory FET 700 in the illustrated example of FIG. 7 corresponds to the memory FET 102 in the illustrated example of FIG. 2. The illustrated example of FIG. 8 shows the formation of a base layer 802 of ferroelectric material on the substrate 106 at the base 706 of the trench 702.

Unlike the illustrated examples of FIGS. 1-5, the base layer 802 in the illustrated example of FIG. 8 is formed using an asymmetric directional deposition technique rather than a conformal deposition technique. As a result, the ferroelectric material (e.g., the base layer 802) is formed on the exposed surface of the substrate 106 without forming additional ferroelectric material up the walls 704 of the trench 702. In some examples, the base layer 802 corresponds to the gate insulator 120 shown in FIG. 1. That is, rather than forming a sacrificial oxide that is subsequently removed and replaced with a final gate insulator, in some examples, the gate insulator 120 that separates the substrate 106 from the sacrificial gate conductor 118 (FIG. 1) is the ferroelectric material used as the base layer 802 shown in FIG. 8. When fabricating logic FETs (e.g., the logic FET 104 of FIGS. 1-5), the initial gate insulator 120 is sacrificial (e.g., temporarily formed and then removed) because it enables other fabrication processes to be implemented before the final gate insulator is added that may otherwise negatively impact at least the upper regions of the gate insulator (e.g., the portions extending up the lateral (e.g., vertical) surfaces of the gate conductor). However, with respect to the example memory FET 700 of FIGS. 7-10, the upper portions (extending up along the walls 704) of the gate insulator 1002 (FIG. 10) are not needed for the memory FET 700 to function properly. Rather, it is the portion of the gate insulator 1002 extending along the substrate 106 underneath the gate conductor 1004 that affects the performance of the memory FET 700. Inasmuch as the sacrificial gate conductor 118 is formed over top of the gate insulator 120, as shown in FIG. 1, other fabrication processes are unlikely to impact the gate insulator 120. As such, there is less concern with retaining the gate insulator 120 of the sacrificial gate 116 for use as the base layer 802 for the memory FET 700 of FIGS. 7-10. Of course, in some examples, a sacrificial oxide may nevertheless still be used in manufacturing memory FETs (as represented in the illustrated example) so that both logic FETs and memory FETs follow the same procedures further into the manufacturing process before separate processes need to be performed for each type of transistor.

Figure 9:
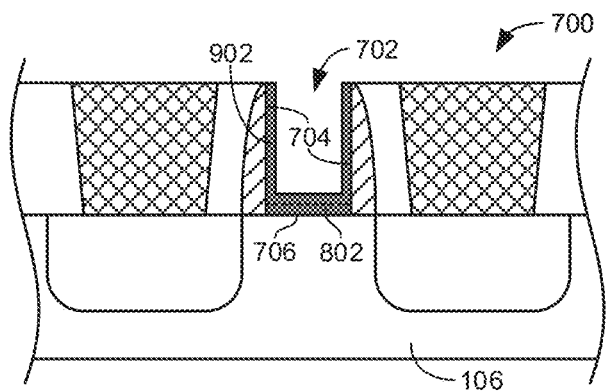

The illustrated example of FIG. 9 shows a subsequent stage of the fabrication process after the formation of a conformal layer 902 of ferroelectric material within the trench 702 on the base layer 802. As shown in the illustrated example, the conformal layer substantially evenly lines the walls 704 and the base 706 (on top of the base layer 802) of the trench 702. For purposes of explanation, a dashed line is shown in FIG. 9 to distinguish the base layer 802 of the ferroelectric material from the conformal layer 902 of the ferroelectric material. However, in some examples, the deposition of the conformal layer 902 on the base layer 802 produces an integrated film of the ferroelectric material substantially without defects at the interface of the two layers 802, 902.

Figure 10:
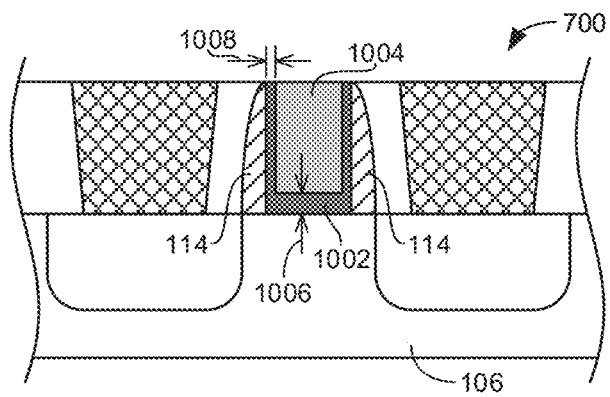
Figure 11:
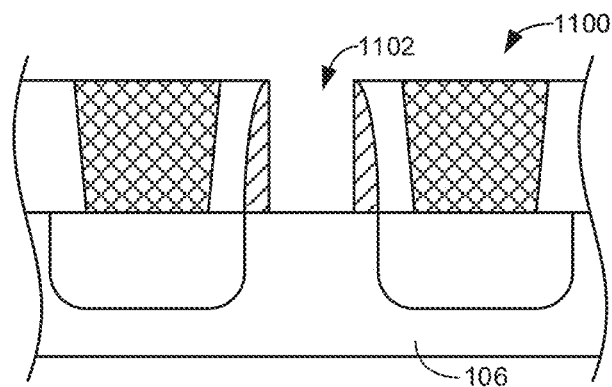
FIGS. 11-14 illustrate progressive stages of fabrication of another example memory FET.
Figure 12:
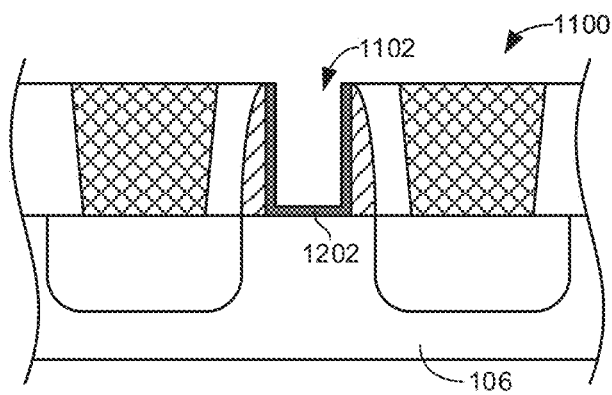

In the illustrated example, the base layer 802 and the conformal layer 902, in combination, correspond to the final gate insulator 1002 shown in FIG. 10 that separates the substrate 106 and the gate conductor 1004. As shown in the illustrated example, a first thickness 1006 of the gate insulator 1002 extending along the bottom surface of the gate conductor 1004 is greater than a second thickness 1008 of the gate insulator 1002 extending up the lateral surfaces or side walls of the gate conductor 1004. As a result, a relatively thick layer of ferroelectric material is achieved at the bottom of the gate without giving rise to gate pinching through a corresponding reduction in the thickness of the gate conductor 1004. In other words, the ferroelectric material separates the substrate 106 from the gate conductor 1004 by a first thickness 1006 and separates the spacers 114 from the gate conductor 1004 by a second thickness 1008 that is less than the first thickness 1006.

FIGS. 11-14 illustrate progressive stages of fabrication of another example memory FET 1100. The stages of fabrication represented in FIGS. 11-14 are substantially the same as those represented in FIGS. 7-10 except that a conformal layer 1202 (FIG. 12) of ferroelectric material is formed within a trench 1102 before a base layer 1302 (FIG. 13) of ferroelectric material is formed. Thus, the memory FET 1100 of FIG. 11 corresponds to the memory FET 700 of FIG. 7 (and the memory FET 102 of FIG. 2). However, while the memory FET 700 of FIG. 8 includes the formation of a base layer 802 of ferroelectric material without extending up the walls 704 of the trench 702, the memory FET 1100 of FIG. 12 includes the conformal layer 1202 of ferroelectric material with a substantially even thickness covering both the bottom surface and the side walls of the trench 1102. Thus, the memory FET 1100 at the stage represented in FIG. 12 generally corresponds to the memory FET 102 at the stage represented in FIG. 3.

Figure 13:
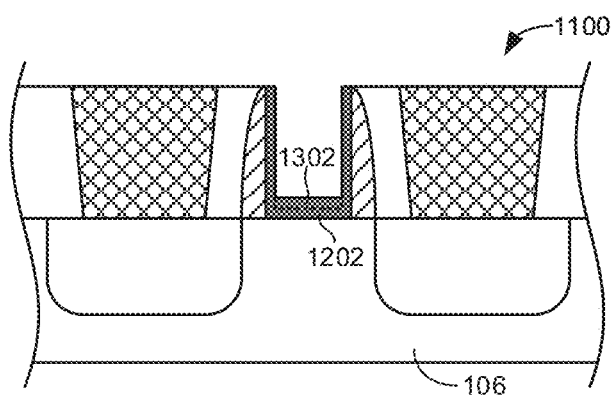
Figure 14:
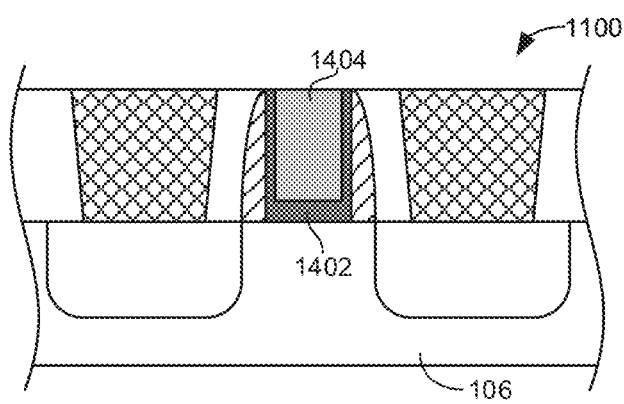

As shown in the illustrated example of FIG. 13, the base layer 1302 is formed on the conformal layer 1202. For purposes of explanation, a dashed line is shown in FIG. 13 to distinguish the base layer 1302 of the ferroelectric material from the conformal layer 1202 of the ferroelectric material. However, in some examples, the deposition of the base layer 1302 on the conformal layer 1202 produces an integrated film of the ferroelectric material substantially without defects at the interface of the two layers 1202, 1302. Thus, although the fabrication processes are slightly different, as a structural matter, the memory FET 700 of FIG. 9 and the memory FET 1100 of FIG. 13 are substantially the same. In the illustrated example, the conformal layer 1202 and the base layer 1302, in combination, correspond to a final gate insulator 1402 shown in FIG. 14 that separates the substrate 106 and a gate conductor 1404. Thus, the memory FET 1100 of FIG. 14 is substantially the same as the memory FET 700 of FIG. 10.

Figure 15:
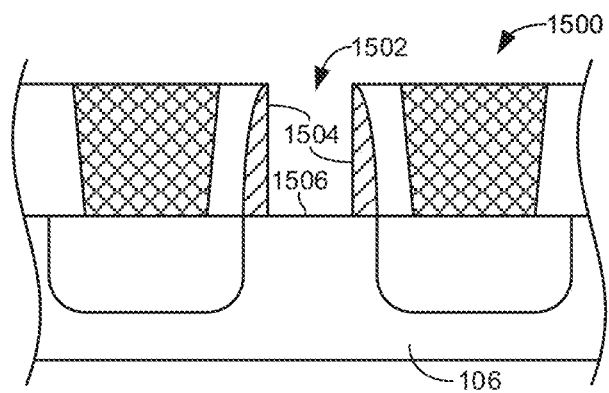
FIGS. 15-17 illustrate progressive stages of fabrication of another example memory FET.
Figure 16:
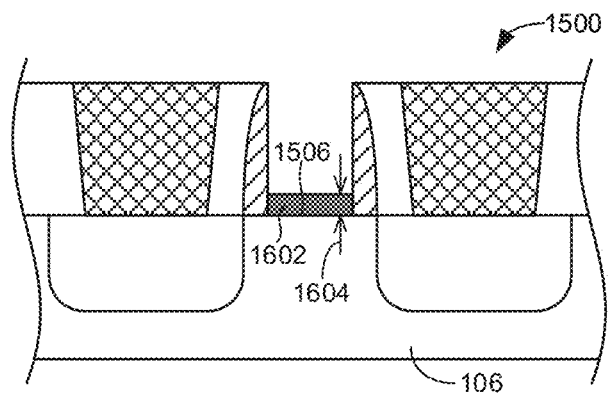
Figure 17:
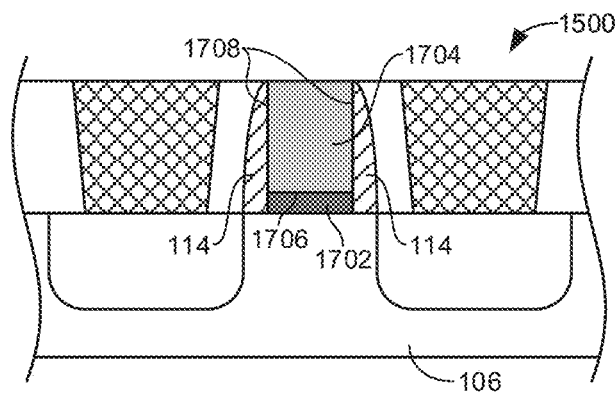

FIGS. 15-17 illustrate progressive stages of fabrication of another example memory FET 1500. The memory FET 1500 in the illustrated example of FIG. 15 corresponds to the memory FET 102 in the illustrated example of FIG. 2 (and the memory FETs 700, 1100 of FIGS. 7 and 11) after removal of a sacrificial gate including a sacrificial oxide (e.g., the gate insulator 120 of FIG. 1). Thus, at the stage represented in the illustrated example of FIG. 15, the memory FET 1500 includes a trench 1502 defined by walls 1504 and a base 1506.

The illustrated example of FIG. 16 shows the formation of a base layer 1602 of ferroelectric material on the substrate 106 at the base 1506 of the trench 1502. The memory FET 1500 of FIG. 16 generally corresponds to the memory FET 700 of FIG. 8 except that the base layer 1602 in FIG. 16 is thicker than the base layer 802 shown in FIG. 8. In some examples, the base layer 1602 of FIG. 16 is formed with a thickness 1604 that corresponds to the desired thickness of the final gate insulator. Thus, in the illustrated example, the thickness 1604 of the base layer 1602 of FIG. 16 corresponds to the thickness 1006 of the gate insulator 1002 shown in FIG. 10 (corresponding to the combined thickness of the base and conformal layers 802, 902 shown in FIG. 9). In some examples, the base layer 1602 corresponds to the final gate insulator 1702 that separates the substrate 106 and a gate conductor 1704 of the memory FET 1500 as shown in FIG. 17.

As shown in the illustrated example, the base layer 1602 of ferroelectric material (i.e., the gate insulator 1702) extends along a bottom surface 1706 of the gate conductor 1704 without extending up lateral (e.g., vertical) surfaces 1708 of the gate conductor 1704. In other words, unlike typical logic FETs (e.g., the logic FET 104 of FIG. 5), the gate insulator 1702 of the memory FET 1500 of FIG. 17 separates the substrate 106 and the gate conductor 1704 while the gate conductor 1704 directly contacts the spacers 114 without ferroelectric material therebetween. In this manner, the memory FET 1500 of FIG. 17 may be scaled to any suitable size without concern for gate pinching arising from the thickness of the ferroelectric material because the thickness of the ferroelectric material along the lateral surfaces 1708 of the gate conductor 1704 is effectively zero because there is no ferroelectric material along the lateral surfaces 1708.

Although the illustrated example of FIGS. 15-17 shows the base layer 1602 being formed after removal of a sacrificial gate (e.g., including both the gate conductor 118 and the gate insulator 120 of FIG. 1), in other examples, the base layer 1602 may correspond to the gate insulator 120 of FIG. 1. That is, in some examples, the base layer 1602 may be formed before formation of the sacrificial gate conductor 118 of FIG. 1 and subsequently uncovered upon the removal of the sacrificial gate conductor 118. Further, in some examples, a portion of the base layer 1602 may correspond to the gate insulator 120 of FIG. 1 (formed before the sacrificial gate conductor 118) while a second portion of the base layer 1602 is formed later on (after removal of the sacrificial gate conductor). Thus, while the base layer 1602 may be formed at one time (during a single process or a series of successive processes), the base layer 1602 may alternatively be formed through multiple procedures separated by one or more intermediate fabrication processes.

Figure 18:
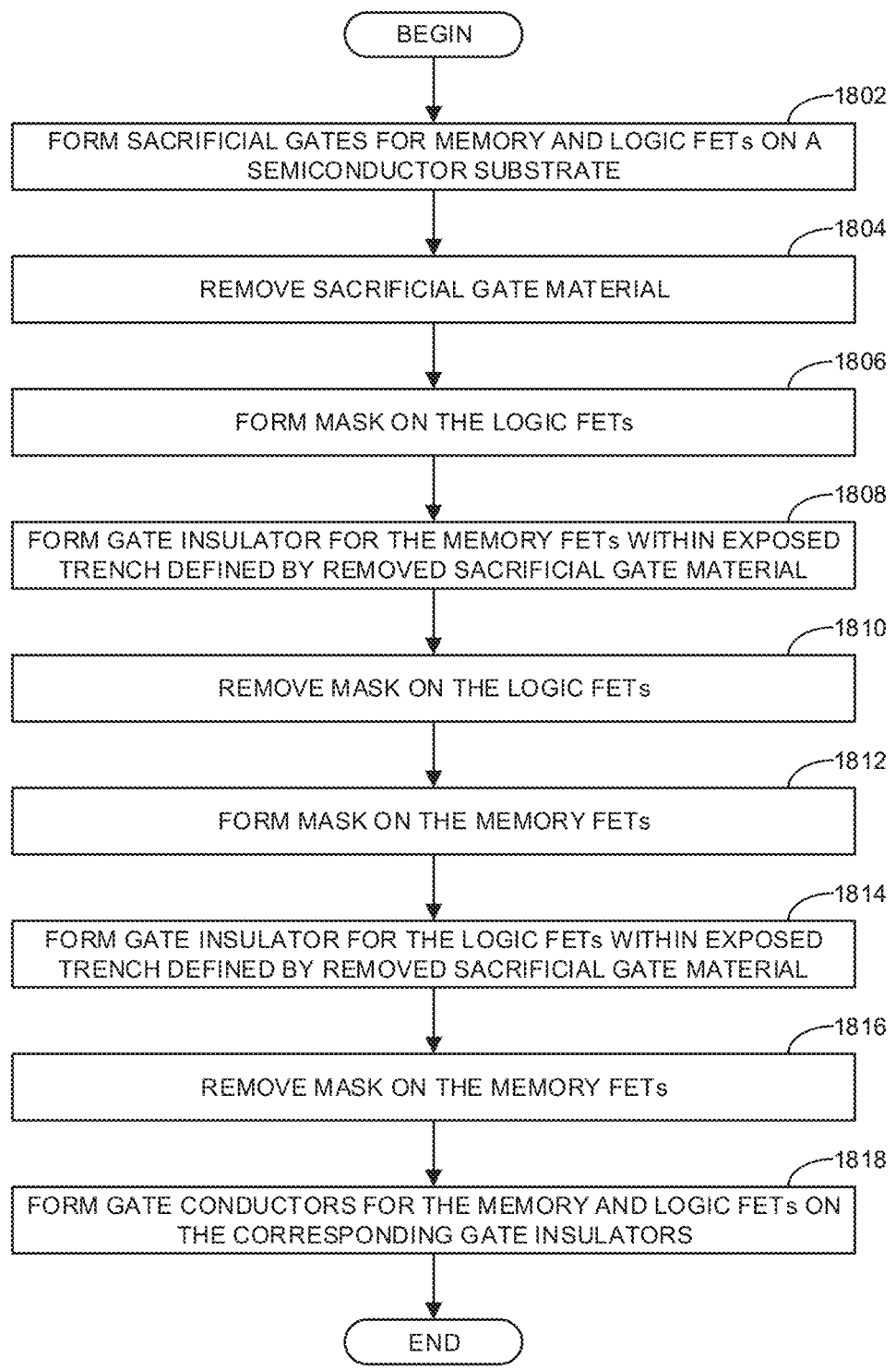
FIG. 18 is a flowchart of an example method to manufacture the example memory and logic FETs of FIGS. 1-17.

FIG. 18 is a flowchart of an example method to manufacture the example FETs 102, 104, 600, 700, 1100, 1500 of FIGS. 1-17. The example method begins at block 1802 by forming sacrificial gates (e.g., the sacrificial gates 116) for memory and logic FETs (e.g., the memory FETs 102, 600, 700, 1100, 1500 and the logic FET 104) on a semiconductor substrate (e.g., the substrate 106). In some examples, the sacrificial gates 116 for both the memory and logic FETs 102, 104, 600, 700, 1100, 1500 include a sacrificial gate conductor 118 and a sacrificial gate insulator 120. In other examples, the gate insulator 120 for the memory FETs 102, 600, 700, 1100, 1500 is not sacrificial. Rather, in such examples, the gate insulator 120 corresponds to a base layer of ferroelectric material (e.g., the base layer 802, 1602) that is temporarily covered by the sacrificial gate conductor 118.

At block 1804, the example method removes the sacrificial gate material. In some examples, this includes both the sacrificial gate conductor 118 and the sacrificial gate insulator 120. In some examples, when the gate insulator 120 for the memory FETs 102, 600, 700, 1100, 1500 is not sacrificial, only the gate conductor 118 is removed. At block 1806, the example method forms a mask (e.g., the mask 302) on the logic FETs 104. With the logic FETs 104 covered by the mask 302, the example method, at block 1808, forms a gate insulator (e.g., the gate insulators 304, 602, 1002, 1402, 1702) for the memory FETs 102, 600, 700, 1100, 1500 within an exposed trench defined by the removed sacrificial gate material. In some examples, the gate insulators 304, 602, 1002, 1402, 1702 for the memory FETs 102, 600, 700, 1100, 1500 are made of ferroelectric material. In some examples, the gate insulators 304, 602, 1002, 1402, 1702 are formed with a thickness at a base of the trench that is greater than up the walls of the trench. In some examples, the gate insulators are formed without ferroelectric material lining the walls of the trench (e.g., the gate insulator 1702 of FIG. 17).

The particular thickness and design of the gate insulators 304, 602, 1002, 1402, 1702 will impact the particular processes involved in the formation of the gate insulators 304, 602, 1002, 1402, 1702. In some examples, a base layer 802 is formed at the base of the trench on the underlying semiconductor substrate 106. The base layer 802 may be formed using an asymmetric directional deposition technique so that the ferroelectric material is not formed on the walls of the trench. Thereafter, a conformal layer (e.g., the conformal layer 902) may be formed on the base layer 802. In other examples, a conformal layer (e.g., the conformal layer 1202) may be formed first, followed by a base layer 1302 formed thereon. In either case, the thickness of the combined layers at the base of the trench will be greater than the thickness of the ferroelectric material extending up the walls of the trench, which corresponds to the thickness of the conformal layer 902, 1202.

In other examples, as mentioned above, the gate insulator may not include any ferroelectric material that extends up the walls of the trench. Rather, the gate insulator is formed exclusively along the base of the trench across the surface of the substrate 106 (and underneath a bottom surface of a final gate conductor subsequently added thereon). In some such examples, the gate insulator corresponds to a directionally deposited base layer on the substrate 106 formed after removal of the sacrificial gate material. In other examples, the gate insulator corresponds to the gate insulator 120 formed prior to the formation and subsequent removal of the sacrificial gate conductor 118. In such examples, block 1808 of the illustrated method may be omitted. In other examples, the final gate insulator corresponds to the gate insulator 120 formed before the sacrificial gate conductor 118 as well as an additional layer of ferroelectric material formed after removal of the sacrificial gate conductor 118.

At block 1810, the example method removes the mask 302 on the logic FETs 104. At block 1812, the example method forms a mask (e.g., the mask 402) on the memory FETs 102, 600, 700, 1100, 1500. At block 1814, the example method forms a gate insulator (e.g., the gate insulators 404) for the logic FETs 104 within an exposed trench defined by the removed sacrificial gate material. The formation of the gate insulator 404 may follow any suitable process for depositing a gate insulator. Typically, such processes involve conformal deposition techniques to form a substantially even layer of a suitable dielectric material that covers both the substrate 106 and the walls of the trench. At block 1816, the example method removes the mask 402 on the memory FETs 102, 600, 700, 1100, 1500.

At block 1818, the example method forms gate conductors (e.g., the gate conductors 502, 604, 1004, 1404, 1704) for the memory and logic FETs 102, 104, 600, 700, 1100, 1500 on the corresponding gate insulators 304, 404, 602, 1002, 1402, 1702. In some examples, the deposition of the metal for the gate conductor for both the memory and logic FETs 102, 104, 600, 700, 1100, 1500 are formed during the same process. In other examples, the gate conductors 502, 604, 1004, 1404, 1704 for the memory FETs 102, 600, 700, 1100, 1500 may be formed at a different time during different processes than the gate conductors 502 for the logic FETs 104. Thereafter, the example method of FIG. 18 ends.

Although the example method is described with reference to the flowchart illustrated in FIG. 18, many other methods of manufacturing the example memory and logic FETs 102, 104, 600, 700, 1100, 1500 in accordance with the teachings disclosed herein may alternatively be used. For example, the order of execution of the blocks may be changed, and/or some of the blocks described may be changed, eliminated, or combined. Similarly, additional operations may be included in the manufacturing process before, in between, or after the blocks shown in FIG. 18.

Figure 19:
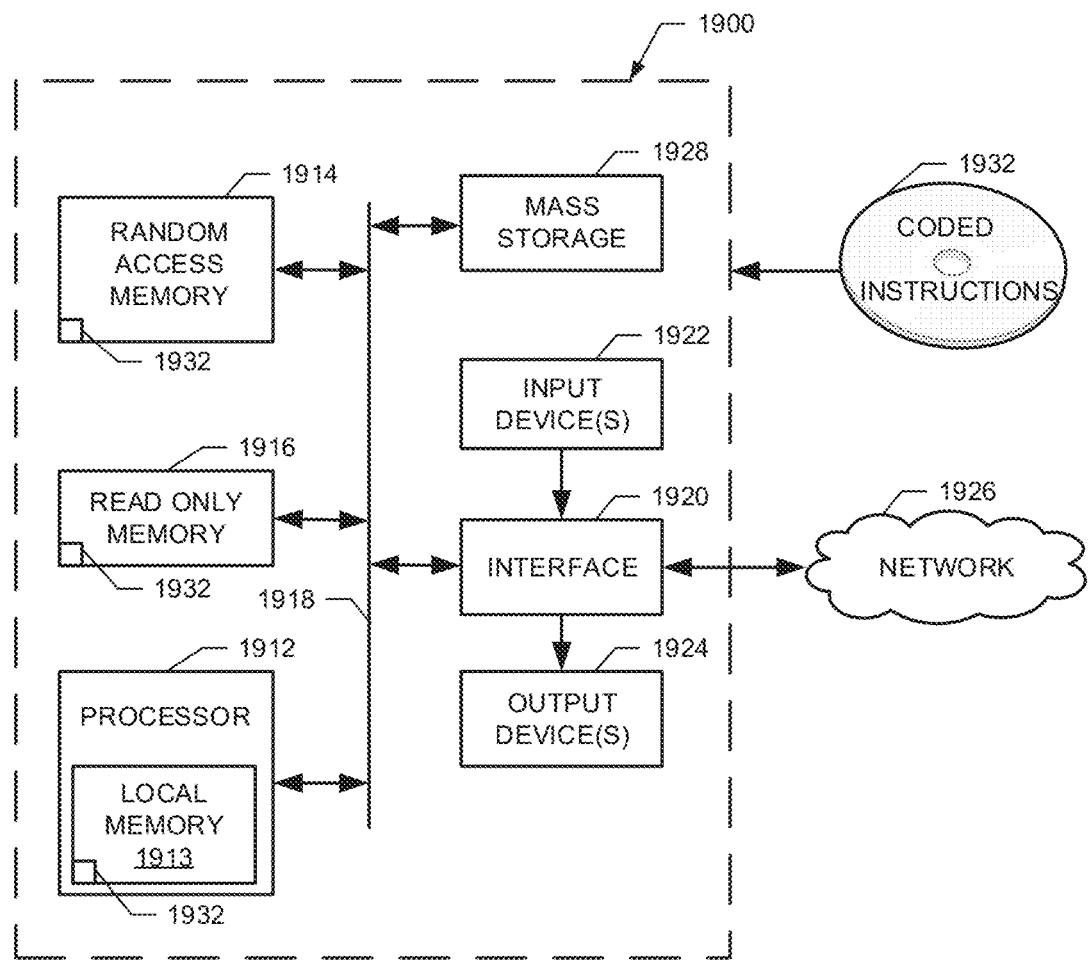
FIG. 19 is a block diagram of an example processor system associated with one or more semiconductor fabrication machines to execute example machine readable instructions represented at least in part by the example method of FIG. 18 to manufacture the example memory and logic FETs of FIGS. 1-17.

FIG. 19 is a block diagram of an example processor platform 1900 capable of controlling one or more semiconductor fabrication machines to execute the method of FIG. 18 to manufacture the memory and logic FETs 102, 104, 600, 700, 1100, 1500 of FIG. 18. The processor platform 1900 can be any other type of computing device.

The processor platform 1900 of the illustrated example includes a processor 1912. The processor 1912 of the illustrated example is hardware. For example, the processor 1912 can be implemented by one or more integrated circuits, logic circuits, microprocessors or controllers from any desired family or manufacturer.

The processor 1912 of the illustrated example includes a local memory 1913 (e.g., a cache). The processor 1912 of the illustrated example is in communication with a main memory including a volatile memory 1914 and a non-volatile memory 1916 via a bus 1918. The volatile memory 1914 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1916 may be implemented by flash memory and/or any other desired type of memory device. Access to the main memory 1914, 1916 is controlled by a memory controller.

The processor platform 1900 of the illustrated example also includes an interface circuit 1920. The interface circuit 1920 may be implemented by any type of interface standard, such as an Ethernet interface, a universal serial bus (USB), and/or a PCI express interface.

In the illustrated example, one or more input devices 1922 are connected to the interface circuit 1920. The input device(s) 1922 permit(s) a user to enter data and commands into the processor 1912. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1924 are also connected to the interface circuit 1920 of the illustrated example. The output devices 1924 can be implemented, for example, by display devices (e.g., a light emitting diode (LED), an organic light emitting diode (OLED), a liquid crystal display, a cathode ray tube display (CRT), a touchscreen, a tactile output device, a light emitting diode (LED), a printer and/or speakers). The interface circuit 1920 of the illustrated example, thus, typically includes a graphics driver card, a graphics driver chip or a graphics driver processor.

The interface circuit 1920 of the illustrated example also includes a communication device such as a transmitter, a receiver, a transceiver, a modem and/or network interface card to facilitate exchange of data with external machines (e.g., computing devices of any kind) via a network 1926 (e.g., an Ethernet connection, a digital subscriber line (DSL), a telephone line, coaxial cable, a cellular telephone system, etc.).

The processor platform 1900 of the illustrated example also includes one or more mass storage devices 1928 for storing software and/or data. Examples of such mass storage devices 1928 include floppy disk drives, hard drive disks, compact disk drives, Blu-ray disk drives, RAID systems, and digital versatile disk (DVD) drives.

Coded instructions 1932 to implement the method of FIG. 18 may be stored in the mass storage device 1928, in the volatile memory 1914, in the non-volatile memory 1916, and/or on a removable tangible computer readable storage medium such as a CD or DVD. As used herein, a non-transitory computer readable storage medium is expressly defined to include any type of computer readable storage device and/or storage disk and to exclude propagating signals and to exclude transmission media.

From the foregoing, it will be appreciated that the above disclosed methods, apparatus and articles of manufacture enable the fabrication of memory FETs that are highly scalable to produce denser and faster memory devices. The scalability (to fabricate smaller memory FETs) is made possible by forming a gate insulator out of a ferroelectric material with a thickness that is greater along a bottom surface of a gate conductor than up the lateral surfaces of the gate conductor. More particularly, the thinner layer of ferroelectric material on the lateral surfaces (or the absence of such material on the lateral surfaces) reduces concerns gate pinching in which there is insufficient space to form the gate conductor. At the same time, the relatively thick layer of ferroelectric material underneath the gate conductor serves to enhance the effect of the ferroelectric properties of the gate insulator. Aside from the gate insulator, example memory FETs disclosed herein have a structure, design, and associated fabrication processes that are substantially similar to those of logic FETs. Accordingly, examples disclosed herein increase the ease with which logic FETs and memory FETs may be integrated onto the same substrate (i.e., the same semiconductor wafer), thereby reducing fabrication costs.

Example 1 includes an apparatus that includes a semiconductor substrate and a ferroelectric gate insulator of a memory field-effect transistor within a trench having walls defined by spacers and a base defined by the semiconductor substrate. The apparatus further includes a gate conductor on the ferroelectric gate insulator, the ferroelectric gate insulator to separate a bottom surface of the gate conductor and the substrate.

Example 2 includes the subject matter of Example 1, wherein the ferroelectric gate insulator includes a ferroelectric material corresponding to at least one of hafnium zirconium oxide, hafnium oxide, zirconium oxide, or a doped form of the at least one of the hafnium zirconium oxide, the hafnium oxide, or the zirconium oxide.

Example 3 includes the subject matter of any one of Examples 1 or 2, wherein a thickness of the gate insulator is greater along the base of the trench than up the walls of the trench.

Example 4 includes the subject matter of any one of Examples 1-3, wherein the gate insulator separates the spacers from the gate conductor. A first thickness of the gate insulator between the spacers and the gate conductor is less than a second thickness of the gate insulator between the substrate and the bottom surface of the gate conductor.

Example 5 includes the subject matter of any one of Examples 1-4, wherein the gate insulator includes a base layer of ferroelectric material and a conformal layer of ferroelectric material. The base layer of ferroelectric material is located along the base of the trench without extending up the walls of the trench. The conformal layer of ferroelectric material is substantially evenly covering the base and the walls of the trench.

Example 6 includes the subject matter of any one of Examples 1-3, wherein the gate conductor directly contacts the spacers without the gate insulator therebetween.

Example 7 includes the subject matter of any one of Examples 1-6, wherein the memory field-effect transistor corresponds to a single memory cell of a memory device.

Example 8 includes the subject matter of any one of Examples 1-7, wherein the memory field-effect transistor is to be used for a non-volatile memory.

Example 9 includes the subject matter of any one of Examples 1-7, wherein the memory field-effect transistor is to be used for a volatile memory.

Example 10 includes the subject matter of any one of Examples 1-9, wherein the gate conductor of the memory field-effect transistor is a first gate conductor and the gate insulator is a first gate insulator. The apparatus further includes a second gate conductor of a logic field-effect transistor on the substrate and a second gate insulator to separate the second gate conductor and the substrate, the second gate insulator includes a dielectric material.

Example 11 is a memory field-effect transistor that includes a semiconductor substrate, and a gate conductor having a bottom surface facing the substrate and lateral surfaces extending away from the substrate. The memory field-effect transistor further includes a ferroelectric material separating the gate conductor from the substrate. A thickness of the ferroelectric material is greater along the bottom surface of the gate conductor than along the lateral surfaces of the gate conductor.

Example 12 includes the subject matter of Example 11, wherein the ferroelectric material extends along the bottom surface of the gate conductor without extending up the lateral surfaces of the gate conductor.

Example 13 includes the subject matter of any one of Example 11 or 12, wherein the memory field-effect transistor corresponds to a single memory cell of a memory device.

Example 14 includes the subject matter of any one of Example 11-13, wherein the memory field-effect transistor is to be used for a non-volatile memory.

Example 15 includes the subject matter of any one of Example 11-13, wherein the memory field-effect transistor is to be used for a volatile memory.

Example 16 includes the subject matter of any one of Example 11-15, wherein the ferroelectric material is at least one of hafnium zirconium oxide, hafnium oxide, zirconium oxide, or a doped form of the at least one of the hafnium zirconium oxide, the hafnium oxide, or the zirconium oxide.

Example 17 is a method to manufacture a field-effect transistor that includes forming a gate insulator for the field-effect transistor on a semiconductor substrate, the gate insulator formed of a ferroelectric material. The method also includes forming a gate conductor on the gate insulator. A first thickness of the gate insulator along a bottom surface of the gate conductor is greater than a second thickness of the gate insulator along lateral surfaces of the gate conductor.

Example 18 includes the subject matter of Example 17, wherein the method further includes forming a sacrificial gate on the substrate, and removing the sacrificial gate to define a trench. The trench defines a shape of at least one of the gate insulator and the gate conductor.

Example 19 includes the subject matter of Example 18, wherein the method further includes forming the gate insulator within the trench by forming a base layer of the ferroelectric material at a base of the trench without forming additional ferroelectric material up walls of the trench.

Example 20 includes the subject matter of Example 19, wherein the base layer is formed on the substrate before forming the sacrificial gate, the sacrificial gate being formed on the base layer.

Example 21 includes the subject matter of Example 19, wherein the method further includes forming the gate insulator within the trench by forming a conformal layer of the ferroelectric material using conformal deposition of the ferroelectric material. The conformal layer covers both the base of the trench and walls of the trench substantially evenly.

Example 22 includes the subject matter of Example 21, wherein the base layer is formed at the base of the trench after formation of the conformal layer, the base layer being formed on top of the conformal layer.

Example 23 includes the subject matter of Example 21, wherein the base layer is formed at the base of the trench before formation of the conformal layer, the conformal layer being formed on top of the base layer.

Example 24 includes the subject matter of any one of Examples 17-23, wherein the field-effect transistor is a memory field-effect transistor.

Example 25 includes the subject matter of Example 24, wherein the method further includes forming a first sacrificial gate on the substrate to define a first space in which the gate conductor of the memory field-effect transistor is to subsequently be formed. The method also includes forming a second sacrificial gate on the substrate to define a second space in which a gate metal of a logic field-effect transistor is to subsequently be formed. The first and second sacrificial gates are formed during a same manufacturing process.

Example 26 includes the subject matter of Example 25, wherein the method further includes removing at least one of the first sacrificial gate or the second sacrificial gate, wherein structures of the memory field-effect transistor and the logic field-effect transistor prior to the removal of the at least one of the first sacrificial gate or the second sacrificial gate are substantially identical being formed as a result of the same processes.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An integrated device, comprising:
   a substrate comprising a semiconductor material;
   a gate conductor having a bottom surface facing the substrate and a lateral surface extending away from the substrate; and
   a ferroelectric material separating the gate conductor from the substrate, a thickness of the ferroelectric material being greater along the bottom surface of the gate conductor than along the lateral surface of the gate conductor, wherein the ferroelectric material comprises a base layer and a conformal layer, the base layer along the bottom surface of the gate conductor without extending up the lateral surface of the gate conductor and the conformal layer substantially evenly covering the bottom surface of the gate conductor and the lateral surface of the gate conductor.

2. The integrated device of claim 1, wherein the base layer is between a portion of the conformal layer and the gate conductor.

3. The integrated device of claim 1, wherein a portion of the conformal layer is between the base layer and the gate conductor.

4. The integrated device of claim 1, wherein the ferroelectric material comprises at least one of hafnium zirconium oxide, hafnium oxide, zirconium oxide, or a doped form of the hafnium zirconium oxide, the hafnium oxide, or the zirconium oxide.

5. The integrated device of claim 1, wherein the gate conductor is a first gate conductor of a memory field-effect transistor and the ferroelectric material is a first gate insulator of the memory field-effect transistor, the integrated device further comprising:
    a second gate conductor of a logic field-effect transistor over the substrate, the second gate conductor having a second bottom surface facing the substrate and second lateral surfaces extending away from the substrate; and
    a second gate insulator of the logic field-effect transistor separating the second gate conductor from the substrate, a second thickness of the second gate insulator being substantially the same along the second bottom surface of the second gate conductor and along the second lateral surfaces of the second gate conductor.

6. The integrated device of claim 5, wherein the thickness of the ferroelectric material along the bottom surface of the gate conductor is greater than the second thickness of the second gate insulator along the second bottom surface of the second gate conductor.

7. The integrated device of claim 5, wherein the ferroelectric material comprises zirconium and oxygen and the second gate insulator is absent zirconium and comprises oxygen and one of hafnium or silicon.

8. The integrated device of claim 7, wherein the ferroelectric material comprises a laminate of at least one layer of hafnium zirconium oxide and at least one layer of hafnium oxide.

9. The integrated device of claim 5, wherein the gate conductor and the second gate conductor comprise the same material.

10. The integrated device of claim 9, wherein the material comprises at least one of titanium, tantalum, tungsten, aluminum, vanadium, platinum, or lutetium.

11. A method to manufacture a field-effect transistor, comprising:
    forming a sacrificial gate on a substrate comprising a semiconductor material;
    removing the sacrificial gate to define a trench, the trench to define a shape of at least one of a gate insulator or a gate conductor, the gate insulator comprising a ferroelectric material;
    forming the gate insulator of the field-effect transistor on the substrate and within the trench by forming a base layer of the ferroelectric material at a base of the trench without forming additional ferroelectric material up walls of the trench and by forming a conformal layer of the ferroelectric material using conformal deposition of the ferroelectric material, the conformal layer covering both the base of the trench and walls of the trench substantially evenly; and
    forming the gate conductor on the gate insulator, a first thickness of the gate insulator along a bottom surface of the gate conductor being greater than a second thickness of the gate insulator along each lateral surface of the gate conductor.

12. The method of claim 11, wherein the base layer is formed on the substrate before forming the sacrificial gate, the sacrificial gate being formed on the base layer.

13. The method of claim 11, wherein the base layer is formed at the base of the trench after formation of the conformal layer, the base layer being formed on top of the conformal layer.

14. The method of claim 11, wherein the base layer is formed at the base of the trench before formation of the conformal layer, the conformal layer being formed on top of the base layer.

15. The method of claim 11, wherein the field-effect transistor is a memory field-effect transistor.

16. The method of claim 15, further comprising:
    forming a first sacrificial gate on the substrate to define a first space in which the gate conductor of the memory field-effect transistor is to subsequently be formed; and
    forming a second sacrificial gate on the substrate to define a second space in which a gate metal of a logic field-effect transistor is to subsequently be formed, the first and second sacrificial gates being formed during a same manufacturing process.

17. The method of claim 16, further comprising:
    removing at least one of the first sacrificial gate or the second sacrificial gate, wherein structures of the memory field-effect transistor and the logic field-effect transistor prior to the removal of the at least one of the first sacrificial gate or the second sacrificial gate are substantially identical being formed as a result of the same processes.

* * * * *